(12) United States Patent
Knobloch

(10) Patent No.: US 8,134,432 B2
(45) Date of Patent: *Mar. 13, 2012

(54) MAGNETICALLY BIASED MAGNETOPROPANT AND PUMP

(76) Inventor: Charles Saron Knobloch, Katy, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/031,411

(22) Filed: Feb. 21, 2011

(65) Prior Publication Data

US 2011/0140816 A1    Jun. 16, 2011

Related U.S. Application Data

(63) Continuation of application No. 11/913,523, filed as application No. PCT/US2006/016761 on May 2, 2006, now Pat. No. 7,893,801.

(60) Provisional application No. 60/677,229, filed on May 2, 2005, provisional application No. 60/677,250, filed on May 2, 2005.

(51) Int. Cl.
*H01F 7/00* (2006.01)
*H01H 55/00* (2006.01)
*H01L 41/00* (2006.01)
*H02N 2/00* (2006.01)
*H04R 15/00* (2006.01)

(52) U.S. Cl. ............... 335/215; 335/3; 310/26; 367/168; 166/280.1

(58) Field of Classification Search ............. 335/3, 215; 310/26; 318/118; 336/20; 361/206; 367/168; 166/280.1, 280.2
See application file for complete search history.

(56) References Cited

U.S. PATENT DOCUMENTS

| | | | | | |
|---|---|---|---|---|---|
| 3,419,776 | A | * | 12/1968 | Kuris et al. | 318/118 |
| 3,484,630 | A | * | 12/1969 | Schwartz | 310/26 |
| 5,588,466 | A | * | 12/1996 | Benz et al. | 137/831 |
| 5,850,109 | A | * | 12/1998 | Mock et al. | 310/26 |
| 6,348,846 | B1 | * | 2/2002 | von Gutfeld et al. | 333/201 |
| 7,210,526 | B2 | * | 5/2007 | Knobloch | 166/248 |
| 7,490,522 | B2 | * | 2/2009 | Ruehrig et al. | 73/862.335 |
| 7,550,189 | B1 | * | 6/2009 | McKnight et al. | 428/116 |
| 7,893,801 | B2 | * | 2/2011 | Knobloch | 335/215 |
| 2006/0028309 | A1 | * | 2/2006 | Racz et al. | 335/215 |
| 2006/0037755 | A1 | * | 2/2006 | Knobloch | 166/308.1 |

* cited by examiner

*Primary Examiner* — Mohamad Musleh

(57) ABSTRACT

Provided is a system and method for enabling pressure or acoustic waves to induce magnetostrictive volume or shape change, providing greater control over magnetopropants. A coating material and the spacing between a magnetopropant and a magnetic particle are selected such that a certain pressure causes change in the relative distance of magnetopropant and magnetic particle, thereby changing the amount of magnetostriction. The coating material, magnetopropant, and magnetic particle are assembled to form a pressure sensitive magnetopropant. Given this structure, changes in pressure will cause a fluctuation of the amount of magnetostriction. In a pore space environment, this causes a change in pore space with resulting change in permeability and, hence, changes in fluid flow.

14 Claims, 1 Drawing Sheet

MAGNETICALLY BIASED MAGNETOPROPANT AND PUMP

CROSS REFERENCE TO RELATED APPLICATIONS

This application is a continuation of the National Stage U.S. application Ser. No. 11/913,523 filed Nov. 2, 2007 of International Application No. PCT/US2006/016761, filed May 2, 2006, now U.S. Pat. No. 7,893,801, which claims the benefit of U.S. Provisional Patent Application No. 60/677,229, filed May 2, 2005 and the benefit of U.S. Provisional Patent Application No. 60/677,250, filed May 2, 2005. International Application No. PCT/US2006/016611, filed May 2, 2006, further claims the benefit of U.S. Provisional Patent Application No. 60/677,229, filed May 2, 2005 and the benefit of U.S. Provisional Patent Application No. 60/677,250, filed May 2, 2005. A U.S. National Stage application Ser. No. 11/913,502 of International Application No. PCT/US2006/016611 is pending.

FIELD OF THE INVENTION

The present invention relates generally to magnetostrictive materials used to vary volume or shape in the presence of a magnetic field. In particular, the present invention relates to the use of magnetic material or particles having mobility relative to magnetostrictive material or particles, enabling pressure or acoustic waves to induce magnetostrictive volume or shape change. A specific application is the use of pressure sensitive magnetopropants in a porous medium to enable movement or pumping of fluids.

BACKGROUND TO THE INVENTION

In general, magnetostrictive materials may be formulated to also contain magnetic material, such as a cobalt or nickel ferro-magnetic alloy, thereby biasing the magnetostrictive material, altering its shape response in the presence of an additional external magnetic field. This biasing technique is blended into the magnetostrictive material, permanently fixing its shape response. Whether biased with a magnetic material or not, the magnetostrictive material is still called a magnetostrictive material.

Magnetostrictive materials, particles in particular, may be used inside a porous medium to change the porosity or permeability properties of the medium. Such materials or particles may be called magnetopropants, alluding to the effect of changing the interstitial volume by exerting force on the matrix of the medium by the change in the shape of the magnetostrictive material. To effect shape change, the magnetostrictive material must be exposed to a magnetic field. It is not always practical to supply a controllable magnetic field of sufficient strength at locations where it is desired to actuate the magnetostrictive material. For instance, it is difficult to supply a controllable magnetic field in a geologic formation at a distance far from a well bore.

SUMMARY OF EXAMPLES OF THE INVENTION

What I am about to describe here is a new way to extend the capabilities of magnetostrictive materials, specifically magnetopropants. Magnetic particles of significant magnetic field strength are added to the propant materials. For instance, a cobalt/nickel ferro-magnetic alloy. These magnetic particles act to provide magnetic bias, or additional magnetic bias, to assist in actuating the magnetopropant. To further enhance the magnetostrictive behavior of the magnetopropant, a vibrational field is introduced. For example, the vibrational field may be created by acoustic stimulation or a pressure wave, such that a relative movement is induced between the magnetic particles and the magnetopropant. The relative movement varies the actuation of the magnetostrictive behavior, causing the desired magenetopropant effect.

In another embodiment, the magnetic particles and magenetopropant are combined in a single material, such as a coating, such that a controlled or specified relationship between the magnetic particle and magnetopropant can be established. In such embodiment, a vibrational field induces a relative movement between the magnetic particles and the magnetopropant within the single material.

In a first set of examples of the invention, there is provided a system for remotely actuating a magnetopropant including: means for disposing a magnetic biasing material in movable proximity to the magnetopropant; and means for inducing a mechanical force in proximity to the magnetopropant, thereby moving the magnetic biasing material relative to the magnetopropant.

In a further example, the means for disposing a magnetic biasing material in movable proximity to the magnetopropant in the above-described system includes a mixture of magnetopropant particles and magnetic particles.

In another example, the means for disposing a magnetic biasing material in movable proximity to the magnetopropant in the above-described system includes an assembly of: a magnetostrictive substance; a coating material; and a magnetic biasing material. In a further example, the coating material includes a resin. In a further example, the coating material includes a gel. In a further example, the coating material provides a range of allowable relative movement between the magnetostrictive substance and the magnetic biasing material. In a further example, the coating material provides a relative fixed positioning between the magnetostrictive substance and the magnetic biasing material.

In another example, the magnetic biasing material in the above-described system includes cobalt-nickel ferromagnetic alloy.

In another example, the means for inducing a mechanical force in proximity to the magnetopropant in the above-described system includes an acoustic wave.

In another example, the means for inducing a mechanical force in proximity to the magnetopropant in the above-described system includes an applied pressure.

In a second set of examples of the invention, there is provided a method for remotely actuating a magnetopropant including the steps of: disposing a magnetic biasing material in movable proximity to the magnetopropant; and inducing a mechanical force in proximity to the magnetopropant, thereby moving the magnetic biasing material relative to the magnetopropant.

In another example, the above-described method for remotely actuating a magnetopropant is used for absorbing acoustic energy.

In another example, the above-described method for remotely actuating a magnetopropant is used as a valve.

In another example, the above-described method for remotely actuating a magnetopropant is used as a pump.

In another example, the mechanical inducing step of the above-described method for remotely actuating a magnetopropant includes applying an acoustic wave in proximity to the magnetopropant.

In another example, the mechanical inducing step of the above-described method for remotely actuating a magnetopropant includes applying a pressure in proximity to the magnetopropant.

In another example, the above-described method for remotely actuating a magnetopropant includes the step of disposing the magnetopropant into a porous medium.

In another example, the above-described method for remotely actuating a magnetopropant includes the step of disposing the magnetopropant in proximity to a geologic formation.

In another example, the above-described method for remotely actuating a magnetopropant includes the step of disposing the magnetopropant in a geologic formation.

In a third set of examples of the invention, there is provided a remotely actuated magnetopropant having an assembly of: a magnetostrictive substance; a coating material; and a magnetic biasing material.

In another example, the coating material of above-described remotely actuated magnetopropant provides a range of allowable relative movement between said magnetostrictive substance and said magnetic biasing material.

In another example, the coating material of above-described remotely actuated magnetopropant provides a relative fixed positioning between said magnetostrictive substance and said magnetic biasing material.

BRIEF DESCRIPTION OF THE SEVERAL DRAWINGS

The present invention and its advantages will be better understood by referring to the following detailed description and the attached drawings in which.

REFERENCE NUMERALS IN DRAWINGS

Figure 1:
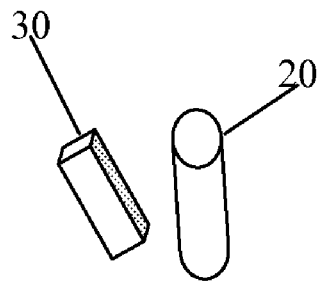
FIG. 1 shows a diagrammatic view illustrating an example of a mixture of magnetopropant particles and magnetic biasing material.

The following elements are numbered as described in the drawings and detailed description of the invention:

| 10 coating material | 20 magnetopropant particles |
|---|---|
| 30 magnetic particle | |

DETAILED DESCRIPTION OF EXAMPLES OF THE INVENTION

Figure 2:
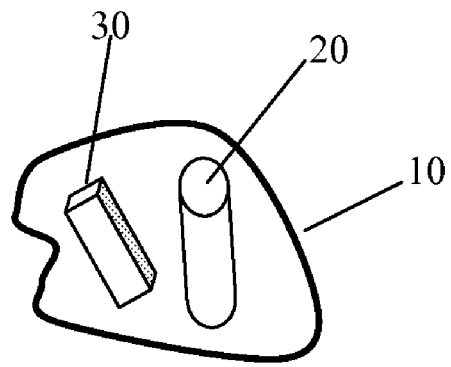
FIG. 2 shows a diagrammatic view illustrating an example of a coating material containing magnetopropant particles and magnetic biasing material.
Figure 3:
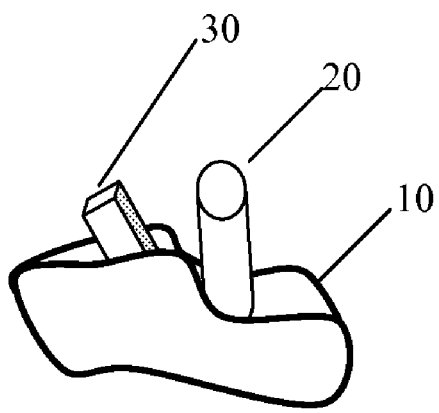
FIG. 3 shows a diagrammatic view illustrating an example of partial emplacement of a coating material containing magnetopropant particles and magnetic biasing material.

Each of FIGS. 1-3 illustrates the pressure sensitive magnetopropant used to produce various aspects of the present invention, though these particular embodiments are illustrated and described herein only for exemplary purposes. Moreover, variations of the system and methods of utilizing the same will become apparent to those of ordinary skill in the relevant structural and mechanical arts upon reading the following disclosure. Thus, the present invention is not to be considered limited to only the structures, systems, and methods described herein.

FIG. 1 illustrates a mixture of magnetopropant 20 particles and a magnetic biasing material, magnetic particle 30. This represents one means for disposing a magnetic biasing material in movable proximity to the magnetopropant. In this configuration, there is no fixed spatial relationship between magnetopropant particles and magnetic particles. The mixture of particles may be embedded or otherwise added to a porous medium. The random relationship and distances between magnetopropant 20 particles and magnetic particle 30 will cause varying levels of actuation, depending on their relative distances and the strength of the pressure wave, acoustic wave, or external magnetic field. The mixture of magnetopropant 20 particles and magnetic particles 30 may be inserted into a medium, such as in proximity to, or in, a geologic formation.

As illustrated in FIG. 2, a coating material 10 may be used to fix a positioning between a magnetopropant 20 and a magnetic biasing material, magnetic particle 30. This represents a means for disposing a magnetic biasing material in movable proximity to the magnetopropant. Coating material 10 may be any of a wide variety of substances that allow for a range of relative movement between magnetopropant 20 and magnetic particle 30 when subject to mechanical forces, pressure, acoustic wave, or magnetic field. Various resins or gels may serve as coating material 10. Magnetopropant 20 may be a magnetostrictive material or particle, which may be coated. Magnetopropant 20 may be alloyed with a magnetic substance, providing an initial fixed magnetic bias. Terfenol and Terfenol-D, in their various formulations, may serve as magnetopropant 20. Magnetic particle 30 may be any of a wide variety of magnetic substances, such as cobalt-nickel ferromagnetic alloys. Conceivably, any magnetic-producing substance or device could serve as magnetic particle 30, such as a microwave diode and coil of small, perhaps nano-scale.

FIG. 3 illustrates a partial emplacement of coating material 10 may be used to fix a relative positioning between a magnetopropant 20 and a magnetic particle 30. This represents a means for disposing a magnetic biasing material in movable proximity to the magnetopropant.

Method of Application

Means are used to induce a mechanical force in proximity to the magnetopropant. As mechanical forces are introduced, such as by acoustic stimulation or applied pressure, these forces cause a relative movement between magnetopropant 20 and magnetic particle 30. Coating material 10 is flexed or squeezed by the mechanical forces. The relative movement between magnetopropant 20 and magnetic particle 30 effects a change in the amount of magnetostriction of magnetopropant 20.

Operation—Pressure Actuated Magnetopropant

Coating material 10 and the spacing between magnetopropant 20 and magnetic particle 30 are selected such that a certain pressure "P" causes change in the relative distance of magnetopropant 20 and magnetic particle 30, thereby changing the amount of magnetostriction. Coating material 10, magnetopropant 20, and magnetic particle 30 are assembled to form a pressure sensitive magnetopropant. Given this structure, a relaxation of pressure "P" will cause a relaxation of the amount of magnetostriction. In a pore space environment, this causes a reduction in pore space with resulting decrease in permeability and, hence, fluid flow. Typically, this allows pressure to build, causing pressure on coating material 10 and changed spacing between magnetopropant 20 and magnetic particle 30. This results in increased magnetostriction, causing increase in pore space and again relaxation of pressure "P". The effect is a pressure-induced pumping or valve action. A linear pathway of such pressure sensitive magnetopropant 40 can produce a siphon-like effect, that of assisted fluid flow in the direction of overall drop in pressure gradient.

The present invention provides a means of remotely actuating a magnetopropant using mechanical force, pressure, or acoustic stimulation.

The present invention provides a means of absorbing mechanical force, pressure, or acoustic energy.

The present invention provides a means to effect changes in porosity and permeability by use of a pressure-induced pumping or valve action.

Although the description above contains many specifications, these should not be construed as limiting the scope of the invention but as merely providing illustrations of some of the presently preferred embodiments of this present invention. Persons skilled in the art will understand that the method and apparatus described herein may be practiced, including but not limited to, the embodiments described. Further, it should be understood that the invention is not to be unduly limited to the foregoing which has been set forth for illustrative purposes. Various modifications and alternatives will be apparent to those skilled in the art without departing from the true scope of the invention, as defined in the following claims. While there has been illustrated and described particular embodiments of the present invention, it will be appreciated that numerous changes and modifications will occur to those skilled in the art, and it is intended in the appended claims to cover those changes and modifications which fall within the true spirit and scope of the present invention.

What is claimed is:

1. An apparatus for absorbing acoustic energy, comprising:
a magnetostrictive material; and
a magnetic substance positioned and arranged in movable proximity to the magnetostrictive material; and
wherein the magnetostrictive material is actuated upon introduction of a mechanical vibrational force upon the magnetic substance; and
wherein the magnetostrictive material and the magnetic substance are embedded in a porous medium, the magnetostrictive material and the magnetic substance positioned and arranged to change the pore volume of the porous medium by exerting force on the medium upon actuation of the magnetostrictive material by the magnetic substance; and
wherein the magnetostrictive material and the magnetic substance are positioned and arranged in the porous medium to absorb acoustic energy.

2. The apparatus of claim 1 wherein the magnetic substance comprises cobalt-nickel ferromagnetic alloy.

3. The apparatus of claim 1 further comprises:
a coating material emplaced between the magnetostrictive material and the magnetic substance; and
wherein the coating material is positioned and arranged to change the relative spacing between magnetostrictive material and the magnetic substance upon application of pressure to the coating material.

4. The apparatus of claim 3 wherein the magnetic substance comprises cobalt-nickel ferromagnetic alloy.

5. The apparatus of claim 3 wherein the coating material comprises a resin.

6. The apparatus of claim 3 wherein the coating material comprises a gel.

7. The apparatus of claim 3 wherein the emplaced coating material is positioned and arranged to provide a range of allowable relative movement between the magnetostrictive material and the magnetic substance.

8. The apparatus of claim 7 wherein the magnetic substance comprises cobalt-nickel ferromagnetic alloy.

9. The apparatus of claim 7 wherein the coating material comprises a resin.

10. The apparatus of claim 7 wherein the coating material comprises a gel.

11. The apparatus of claim 3 wherein the emplaced coating material is positioned and arranged to provide a relative fixed positioning between the magnetostrictive material and the magnetic substance.

12. The apparatus of claim 11 wherein the magnetic substance comprises cobalt-nickel ferromagnetic alloy.

13. The apparatus of claim 11 wherein the coating material comprises a resin.

14. The apparatus of claim 11 wherein the coating material comprises a gel.

* * * * *